United States Patent [19]
Harwood

[11] 3,965,457
[45] June 22, 1976

[54] DIGITAL CONTROL PROCESSOR

[75] Inventor: Keith Harwood, Brunswick, Australia

[73] Assignee: L.M. Ericsson Pty. Ltd., Australia

[22] Filed: Nov. 13, 1973

[21] Appl. No.: 415,423

[30] Foreign Application Priority Data
Nov. 13, 1972  Australia............................ 1198/72

[52] U.S. Cl. ............................................... 340/172.5
[51] Int. Cl.² ................... G06F 15/46; G05B 15/02; G05B 19/02
[58] Field of Search ............. 340/172.5; 179/18 GF; 235/151.11; 178/6.7 R

[56] References Cited
UNITED STATES PATENTS

| | | | |
|---|---|---|---|
| 3,079,589 | 2/1963 | Mol et al. .......................... | 340/172.5 |
| 3,245,006 | 4/1966 | Mattlet ............................. | 340/172.5 |
| 3,651,484 | 3/1972 | Smeallie........................... | 340/172.5 |
| 3,727,006 | 4/1973 | Jacob................................ | 179/18 GF |
| 3,753,243 | 8/1973 | Ricketts, Jr. et al............. | 340/172.5 |

*Primary Examiner*—Gareth D. Shaw
*Assistant Examiner*—Michael C. Sachs
*Attorney, Agent, or Firm*—Cushman, Darby & Cushman

[57] ABSTRACT

A digital control processor for controlling a number of relay sets from digital information received from a digital PABX. The digital control processor consists essentially of a first-in first-out memory and a combinational logic unit. The memory stores information relevant to an operation to be performed by the processor and re-cycles the information until the operation has been performed. The memory determines the action of the combinational logic unit which action includes changing the state of one of the relay sets. The action of the combinational logic unit is determined by time varying data states from the memory and/or from a relay set or sets. The digital control processor acts as an interface device between the digital/electronic world of the PABX and the analogue/mechanical world of the public exchange. The device receives digital information from a processor in the PABX and also monitors the current state of all the relay sets. The device accepts a digital signal from the PABX processor in a short time, which information relates to an action to be performed by one of the relay sets and may include information indicating a digit to be transmitted to line in the form of impulses. The device then causes the relevant relay set to perform the desired action without further reference to the PABX processor. The device is capable of locating the relay set which has been in a particular state for the longest period of time upon request from the PABX processor for a relay set in that state.

4 Claims, 3 Drawing Figures

FIG_2.

DIGITAL CONTROL PROCESSOR

This invention relates to a control processor and more particularly to a control processor device suitable for digital control of one or more functions.

For example, the processor of the invention may be utilised for digital control of one or more slowly operating electro-mechanical functions or may be utilised for digital control of a plurality of high speed functions from a single digital source.

The invention has particular utility in interfacing a digital PABX telephone system with an external analogue system wherein two-way junction relay sets for signalling and voice frequency transmission to the external system operate at slow speeds relative to the digital control system.

Accordingly, the invention provides a digital control processor including a memory unit, a combinational logic unit and means for bidirectional communication with one or more external devices, said memory unit being adapted to determine the action of the combinational logic unit, which action includes changing the state of one or more of said external devices, the action of said combinational logic unit being determined by time varying data states from said memory unit and/or said external devices.

In order that the invention may be more readily understood one particular embodiment will now be described with reference to the accompanying drawings wherein.

This embodiment is directed to a digital control processor suitable for use as an interface between a digitally controlled PABX telephone system and an external analogue system. According to the preferred embodiment the PABX has six two-way junction lines with the outside system. One such PABX is described in our co-pending patent application Ser. No. 415,424 entitled "Time Division Multiplexed Digital Switching Apparatus" and filed concurrently with the present application.

In accordance with this embodiment the control processor device is used to accept, in a short time, a signal from the PABX processor not shown giving the number of one of the two-way junction relay sets, a number indicating an action to be performed and possibly a further number indicating digit to be transmitted to line in the form of impulses. The device must then cause the relevant relay set to perform that action without further reference to the PABX processor. Furthermore, the device must monitor the current state of all the relay sets and when the PABX processor requests that a relay set in a particular state be found it must send the number of the relay set which has been in that state for the longest period of time to the PABX processor. For example, if the PABX processor requests a free junction the device must locate the junction relay set which has been in the free state for the longest period of time. Similarly, when an incoming call sounds an alarm and a call is answered by one of the PABX extensions the device must transmit to the PABX processor the number of the relay set carrying the incoming call which has been waiting for the longest period of time.

Figure 1:
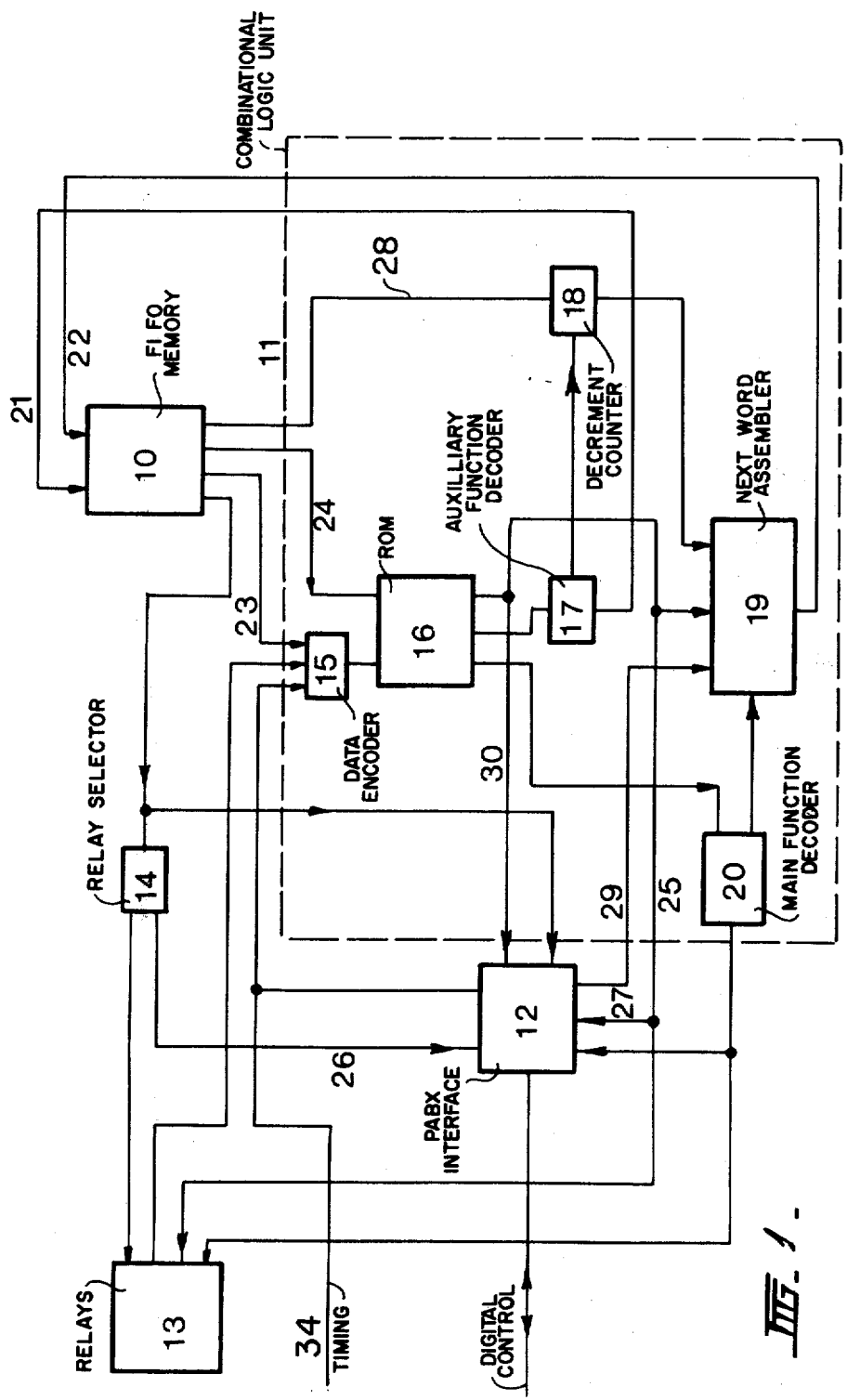
FIG. 1 is a simplified block diagram of the embodiment.

In FIG. 1 the control processor device of this embodiment is shown to consist essentially of a first in first out (FIFO) memory 10 and a combinational logic unit which is enclosed within the dotted lines 11. A first-in first-out memory is an information storage means characterised by the fact that information which is stored is retrieved from the storage in the same order in which it is inserted into the memory. It may comprise a delay line, or a shift register, or a random access memory controlled by a counter such that words of the memory are accessed in a fixed order or, as in the preferred embodiment, a device specifically constructed as a first-in first-out memory. Digital information from the PABX enters the device via a PABX interface unit 12 which will be explained more fully hereinbelow and signals from the device are transmitted to six two-way junction relay sets or units designated generally at 13. Reference unit 14 designates a device selector which selects one of the relay units in the block 13. In the preferred embodiment unit 14 is an address decoder such as Texas Instruments device SN74L42.

The relay units 13 are simple devices and require constant supervision by the control processor device. Each relay unit contains four relays which are named F1 to F4. These relays are accessed directly by the control processor device which can operate or release them. The relay units also contain two detectors for A.C. signals which may appear on the line. The relay units cannot execute any function except under the direct control of the control processor device. The relay units will be referred to hereinafter as the controlled external devices.

The PABX processor is a complex device which is required to perform many functions. The PABX processor should not be held up for more than a millisecond because it is required to perform many functions other than signalling to the control processor device. The PABX processor operates independently of the control processor device and may issue requests to the control processor via interface 12 at any time. The PABX processor may be considered as a privileged external device.

The combinational logic unit 11 includes a data encoder 15, a read only memory (ROM) 16, an auxiliary function decoder 17, which in the preferred embodiment is a four-bit adder such as Texas Instruments device Ser. No. 7483, a decrement device 18 which in the preferred embodiment is a Texas Instruments Ser. No. 74L42 device, a next word assembler 19 which comprises two separate integrated circuit packages, such as, for example, National Semiconductor devices DM8123 and DM 8095 and a main function decoder 20. The main function decoder may be in the form of the Texas Instruments Ser. No. 74L42 BCD-to-decimal decoder.

The memory 10 may store up to sixty four words and has an inlet and an outlet. If a word is presented at the inlet via the connection 22 and a shift in signal is applied via the connection 21 the word is stored in the memory 10. If there are one or more words stored in the memory 10 the word which was stored first will appear at the outlet of the memory 10 and the memory will signal output ready.

If a shift out signal is applied to the memory 10 then the word appearing at the outlet at that time will be removed and the following word will appear at the outlet. Words appear at the outlet in the same order as they were presented at the inlet.

The words stored in the memory 10 are of twelve bits. Three bits of the word supply the address of one of the relay units. When the memory 10 signals output ready, the three bits are decoded by the device selector 14 and select one relay unit. Information from that unit is transmitted to the data encoder 15 as shown in FIG. 1.

A one bit field called the timing field is transmitted from the memory 10 to the encoder 15 via the connection 23. Timing information from an external unit (not shown) is also transmitted to the encoder 15 via connection 34. The information entering the encoder 15 is converted into a three bit field which provides part of an address to the ROM 16. A four bit field from the memory 10 is transmitted directly to the address inputs of the ROM 16 via connection 24. This four bit field is called the sequence state field. The three bits from the encoder 15 and the four bits from the memory 10 are combined into a seven bit address for the ROM 16.

The ouput of the ROM 16 is eight bits which are divided into three fields. Two of the fields comprise two bits each of which cause one of four instructions to be executed and the remaining four bit field is used as data for the instructions. The main function field of two bits is applied to the function decoder 20 which can execute one out of four instructions. These instructions are set relays, signal PABX processor, set state and set count.

In the set relays instruction the four bits of the data field from the ROM 16 are transmitted to the relay unit selected by the device selector 14 via connection 25. In the signal PABX processor instruction the four bits from the data field together with the three bits from the memory 10 are transmitted to the interface unit 12 via connections 27 and 26, respectively.

The set state and set count instructions are used to assemble another word in the next word assembler 19 for entry into the memory 10 via the connection 22.

The other two bits from the ROM 16 comprise the auxiliary function field and control the assembly of another word and its rewrite into the memory 10. This function is mediated by the auxiliary function decoder 17.

A second four bit field from the memory 10 is called the count field which is transmitted via connection 28, to the decrement device 18. One of the instructions in the auxiliary function field is to reduce the value of the count field by one using the decrement device 18 and assemble the new count field into a new word. A second function of the auxiliary function field is to prevent the rewriting of any word back into the memory 10. This has the effect of erasing a word from the memory 10.

The words in the memory 10 can select one of the six relay units. One word in the memory 10 always selects the PABX processor. This word is called the end word because the PABX processor is treated as relay unit zero which does not exist. When the PABX processor is selected by the memory 10, the action of the main function field from the ROM 16 is altered.

The functions which are performd are firstly to copy a word from the PABX processor into the memory 10 via the interface unit 12 and connection 29. Nothing happens in the interface unit 12 in this case. Secondly, to start a search mechanism, thirdly to stop a search mechanism and fourthly to set the count field. The search mechanism is considered as part of the interface unit 12. When one of the controlled devices (relay units 1 to 6) attempts to signal the PABX processor and the search mechanism or device is turned off, then the PABX processor is not signalled and no action takes place. If the search device is turned on at this time then the contents of the data field from the ROM 16 are transmitted to the interface unit 12 via connection 30 wherein they are compared with the information required by the PABX processor. If this word from the memory 10 has the information required by the PABX processor then it is transmitted to the PABX processor and the word assembled for entry into the memory unit is not entered.

The sequence of events in the operation of the memory 10 are as follows:

a. Each word in the memory 10 refers to one relay unit. Associated with each relay unit is a single latch containing "Done" bit. The end word clears the done bit in each relay unit. When a subsequent word addresses a particular relay unit, the associated "done" bit is set. If a second word in the memory 10 addresses the same relay unit, the word is ignored. Thus, the first word referring to a particular relay unit can operate on that relay unit, subsequent words cannot. In this way, although several words in the memory may refer to one particular relay unit, effectively they can operate only one at a time. Thus the memory 10 acts firstly as a memory with respect to all relay units, secondly it acts as a memory with respect to each relay unit. If the PABX processor inserts several words, referring to one particular relay unit, in the memory 10 these words will be operated on in the same order at which they are inserted. The time sharing effectively provides a memory for each relay unit.

b. Any word in memory 10 can erase itself. If there are two or more words referring to a particular relay unit, the first has control. When the operation being performed by that word is finished, it erases itself and the next word has control. Operations are performed in the order in which the words appear in memory 10. Each operation is completed before the subsequent one is started. Erasure can be conditional on the done bit being set or can be unconditional.

c. Insertion of words into the memory is controlled by the "End" word. The "End" word determines whether the word is to be inserted and causes the insertion. The "End" word is then copied into the memory 10. The newly inserted word is immediately before the "End" word. The word in control is the first word (referring to the same relay unit) after the "End" word. Operations are performed in the same order as that in which they are inserted.

d. Words referring to relay units other than relay unit 0 can perform four actions controlled by the main function decoder 20:

i. They can set the relay unit relays into a particular state,
ii. They can set a count field within the word,
iii. They can alter the state field of the word,
iv. They can signal the PABX processor. At the same time as any of the above the word can also decrement the count field by one and can inhibit the normal copying of the word back into memory (thus erasing the word from the memory) controlled by the auxiliary function decoder 17. The decrement device 18 is the arithmetic unit which is used to decrement the count field.

e. The "End" word can perform four actions depending on signals from the PABX processor:
  i. If the PABX processor is making no request, the "End" word will generate an "idle" word. The relay unit number for the word is obtained from the count field of the "End" word. The count field is then decremented so that successive appearances of the "End" word generate successive relay unit numbers.
  ii. If the PABX processor is requesting an insertion, that is, it wants to send a control function to a particular relay unit, the "End" word copies the word from the PABX processor into the memory 10. As noted above, the insertion is made immediately before the "End" word so that control words appear in the memory in the order in which they are required.
  iii. If the PABX processor is requesting a relay unit in a particular state ("Idle", "Incoming Call" or "Recall") the "End" word starts the search. When the search is on, and a word performs the appropriate signal PABX processor instruction, then the PABX processor takes the relay unit number and the word is deleted from the memory.
  iv. If the PABX processor is requesting a search, and the search has already been started by the "End" word last time around) then the memory 10 has cycled once without finding a relay unit in the required state. The PABX processor is given the relay unit number of the "End" word, i.e., zero, to indicate the failure of the search. The "End" word is not deleted.

There are four non-overlapping sequential timing pulses $T_0$, $T_1$, $T_2$ and $T_3$ which are provided by a timing unit (not shown). The timing pulses enter the combinational logic unit 11 at the encoder 15 through connection 34. At T3 the timing unit sends a pulse on the shift-out, this causes a selection of a word from the memory 10 at the following $T_0$. The input ready and output ready signals from the memory are read into a flip flop. Unless both are ready further action cannot take place. Valid data will appear at the output of the memory 10 at some time before $T_0$. The sequence state field from the output is presented directly to a read only memory (ROM) 16. The relay unit number field is decoded in the device selector 14 and accesses one of the relay units. Information from this relay unit consists of the state of two of four relays ($F_1$ to $F_4$) which make up each relay unit, and the existence of a signal such as the ringing signal which is sent to the combinational logic unit 11. The count field is tested for zero and the appropriate timing signal is selected by the timing field in the word at the output of the memory 10. This information is encoded into 3 bits which also address the ROM 16 together with the sequence state field. The 7 bit address into the ROM selects an instruction which is then performed at T2 and which may alter the state of the relay unit.

The relay states and timing information are encoded as follows. Whenever the count field is zero the encoded information is 000. Whenever one of several detectors in the relay unit, for example, ringing detector or a.c. clear detector is operating, the encoded form is 001. The other 6 codes refer both to the state of the relays and the timing information. If neither the F1 or F2 relays of the relay unit are operating then the code is 01X. If either of those relays are set or the early guard detector has detected a signal the code is 10X and if both of them are operating then the code is 11X. The value of X in all the above cases is derived from either a 10.4Hz clock with a mark to space ratio of 2 to 1 or from a 3 second interval timing derived from the system clock generator. These are selected by the timing select field of the memory 10.

The state field is chosen arbitrarily that is, the state field has no intrinsic meaning; it only identifies the current position in a signalling sequence. The 7 bits from the timing code and the state field address the ROM 16 of the combinational logic unit 11 which is a 1,024 bit ROM. An 8 bit output (D0 - D7) of the ROM 16 causes the execution of the instruction, 2 bits D6 and D7 from the ROM select the instruction type.

| $D_7$ | $D_6$ | Action |
|---|---|---|
| 1 | 0 | Set state |
| 1 | 1 | Set count |
| 0 | 0 | Set relays |
| 0 | 1 | Signal PABX Processor |

The set relay instruction sets the state described in bits D0 to D3 of the ROM 16 output into four latches on the relay unit selected by the memory 10. In this way it is possible to change all relays simultaneously even if it is not necessary to do so. It does mean, however, that there is no decode logic on the relay units.

The instruction to signal the PABX processor does not normally perform any action. When the PABX processor has started a search, the conditions of bits D0 to D3 are selected by two bits of a four bit field specifying the required action of the PABX processor instruction. The instruction to signal PABX processor is used to indicate that the particular relay unit is in a state either idle or with a new call or with a parked call, or is in the middle of a dialling sequence. The set state and set count instructions send the information from D0 to D3 to the state field or count field of the memory 10 input. The action peformed by the auxiliary function field is as follows.

| $D_5$ | $D_4$ | Action |
|---|---|---|
| 0 | 0 | Decrement to count field |
| 0 | 1 | Erase this word |
| 1 | 0 | Do nothing |
| 1 | 1 | Erase this word if Done Bit is set |

In normal operation the current values of the state and count fields at the output of the memory 10 are copied back to the input. The D5 operation simply subtracts one from the count field bit. D4 of the instruction is used to control the re-writing of information back into the memory 10. If D4 is one then no information is re-written and the word is effectively erased.

The end word as mentioned above refers to relay unit 0 which does not exist. This relay unit number is used as the signalling interface between the PABX processor and the device of this invention. The timing coding is performed as follows. If the count field of the end word is 0 the timing code is 000 as the case with normal words. If the PABX processor is making no request of the device then the timing code is 001. The code 01X indicates when the PABX processor is requesting the insertion of an instruction into the memory 10, the code 10X indicates that the PABX processor is requesting that the device search for a relay unit in a particular state. The code 11X indicates that the device has started such a search and has not found the required relay unit.

The operations that end word can perform are selected by bits D6 and D7 as with the ordinary words, however, the action they perform is different.

| D₇ | D₆ | Action |
|---|---|---|
| 1 | 0 | Insert |
| 1 | 1 | Set count |
| 0 | 0 | Start search |
| 0 | 1 | End search |

The instruction code in the ROM 16 for a search request from the PABX processor is the start search instruction, this has no action except to turn on a search flip flop. This flip flop enables the search mechanism and since it is the end word which starts the search, words in the memory 10 are searched from the oldest to the youngest. If while the search is underway the relay unit word signals the PABX processor then the device is halted immediately, the PABX processor can then read the number of the relay unit from the count field of the memory 10 and continue. When it does so, at T3 the device is re-started. Since the device is stopped before T2 the re-write pulse, which normally occurs at T2, is omitted so that when the PABX processor has read a word from the memory 10, this word is erased from the memory. If the search continues until the end word is found again, the ROM 16 is coded to end the end search instructions. This instruction also holds the device until such time as the PABX processor reads the relay unit number, which in this case is 0, from the memory. However, when the PABX processor does read this number the relay unit is started immediately so that the end word is re-written into the memory 10. The action of the search sequence is as follows. Whenever there are one or more relay units in the required state in the memory 10 then the one which has been in that state the longest will be selected, its number removed to the PABX processor and it will be deleted from the memory 10. If there is no such relay unit then the device signals 0 to the PABX processor and performs no deletion.

The insert instruction of the end word is used both to accept instructions from the PABX processor to a particular relay unit and to test relay units for busy or faulty conditions. If the PABX processor is requesting an insertion, information therefrom is copied into the relay unit number field of the memory 10, the contents of the four bit field specifying the required action are copied into the state field of the memory 10 and further information from the PABX processor is copied into the count field. This insertion takes place at time T2 and further action on the memory 10 is prevented until the subsequent T2 when the end word itself is copied to the memory 10.

If the PABX processor is not requesting any action on the device, the end word will insert an idle word for one of the relay units. The relay unit number is taken from the count field of the memory, the state is strapped to idle and the count field strapped to 0. This operation also subtracts 1 from the count field of the end word so that on subsequent cycles of the memory all relay units have an idle word in the memory.

f. The "idle" word is programmed to erase itself if the done bit is set. Thus, when the "End" word inserts and "Idle", as per (e)(i) above, referring to a relay unit which is referred to elsewhere in the memory 10, i.e., when the relay unit is performing some action, the superflous "Idle" circulates once and is immediately erased, Further the "Idle" state is programmed so that if any of the relays of the relay unit are set, the word is deleted. This ensures that a relay unit in a normal busy state is detected as such. Also, connections carrying signals from the relay units to the device are wired so that if a relay unit is not plugged in, relays seem to be set and so the device never signals "Idle" to the PABX processor for a non-existent relay unit.

Figure 2:
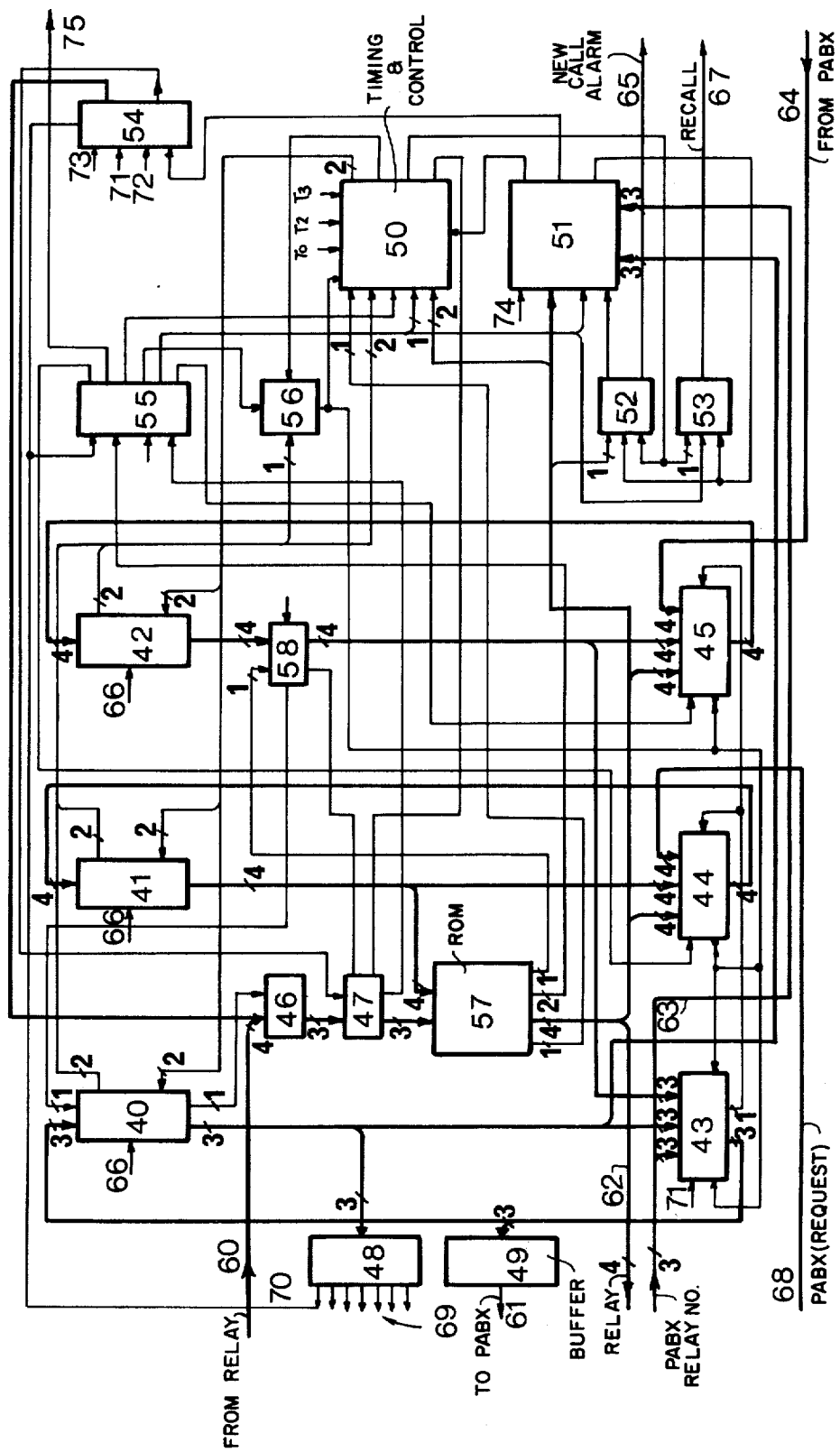
FIG. 2 is a more detailed block diagram of the embodiment.

Referring now to FIG. 2 wherein the construction of the device is shown in more detail it can be seen that the memory 10 (FIG. 1) consists of three FIFO's numbered 40, 41 and 42, respectively. The next word assembler 19 (FIG. 1) can be seen in FIG. 2 to comprise three multiplexers 43, 44 and 45 respectively.

The data encoder 15 (FIG. 1) is shown in FIG. 2 to comprise an encoder 46 and a buffer store 47. The encoder is a combination of conventional logic elements for receiving the timing signals from the PABX on line 60, the timing bit from storage 40, etc., and generates part of the address of the ROM 57. Such a circuit can be simply designed by one skilled in the art. The PABX interface unit 12 (FIG. 1) is shown to comprise a PABX processor interface buffer 49, a timing and control unit 50 and some searching equipment indicated by the block 51. The search equipment circuit 51 includes a Texas Instruments Ser. No. 74L85 multiplexer and a Fairchild 93L12 multiplexer. In addition, this circuit includes a number of conventional logic elements arranged by conventional techniques known in the art to provide the aforementioned searching function. The timing and control unit 50 includes a pair of flip-flops and some conventional logic elements for appropriately controlling the timing of the respective elements of the processor so that the timing of the operation of the elements of the processor are appropriately synchronized. Such a timing circuit can be arranged by conventional techniques known in the art and accordingly is not illustrated herein in detail. A relay unit address decoder 48 (FIG. 2) is identical with the device selector 14 of FIG. 1 and as aforementioned is a Texas Instruments Ser. No. 74L42 device. Also included in this unit are a night call alarm buffer store 52, a recall buffer store 53 and a number of gates 54 which operate when relay unit zero is selected to send information from the PABX processor to the encoder 46.

The main function decoder 20 (FIG. 1) is shown in FIG. 2 to comprise an instruction decoder 55 and a flip-flop 56. The ROM 16 and the decrement device 18 (FIG. 1) remain unchanged in FIG. 2 as these need not be broken down further and they are represented by reference numerals 57 and 58, respectively, in FIG. 2.

In FIG. 2 the number of bits of digital information transmitted by the various interconnections are illustrated by a number between 1 and 9 associated with a short line crossing the connection line. Input 66 to the three FIFO's 40, 41 and 42 represents a master reset input.

In FIG. 2 connections to and from the device to the external system are as follows:

Connection 60 is from the relay units and contains four bits representing the state of the detectors, the done bit and the state of the relays.

Connection 61 is a tri-state bus to the PABX processor.

Connection 62 is to the relay units and contains four bits indicating the relay state to be set.

connection 63 is from the PABX processor and has three bits specifying the number of the junction relay unit to be used.

Four bits on Connection 64 come from the PABX processor and specify a digit from the PABX extension which is to be sent to line.

Connection 65 is to the new call alarm and 67 is a recall connection.

Connection 68 is from the PABX processor and carries a code indicating the request from the PABX processor to the common digital processor device. The outputs 69 from the relay unit address decoder 48 go to the respective relay units whilst output 70 represents relay unit zero. Input 71 to the multiplexer 43 and the unit 54 is a signal from the PABX processor and enters the device by way of connection 68 as do connections 72 and 73 to the unit 54 and connection 74 to the block 51. Connection 75 from the decoder 55 goes to the relay units and specifies that the relay unit addressed by 48 sets its relays to the state specified on connection 62.

Figure 3:
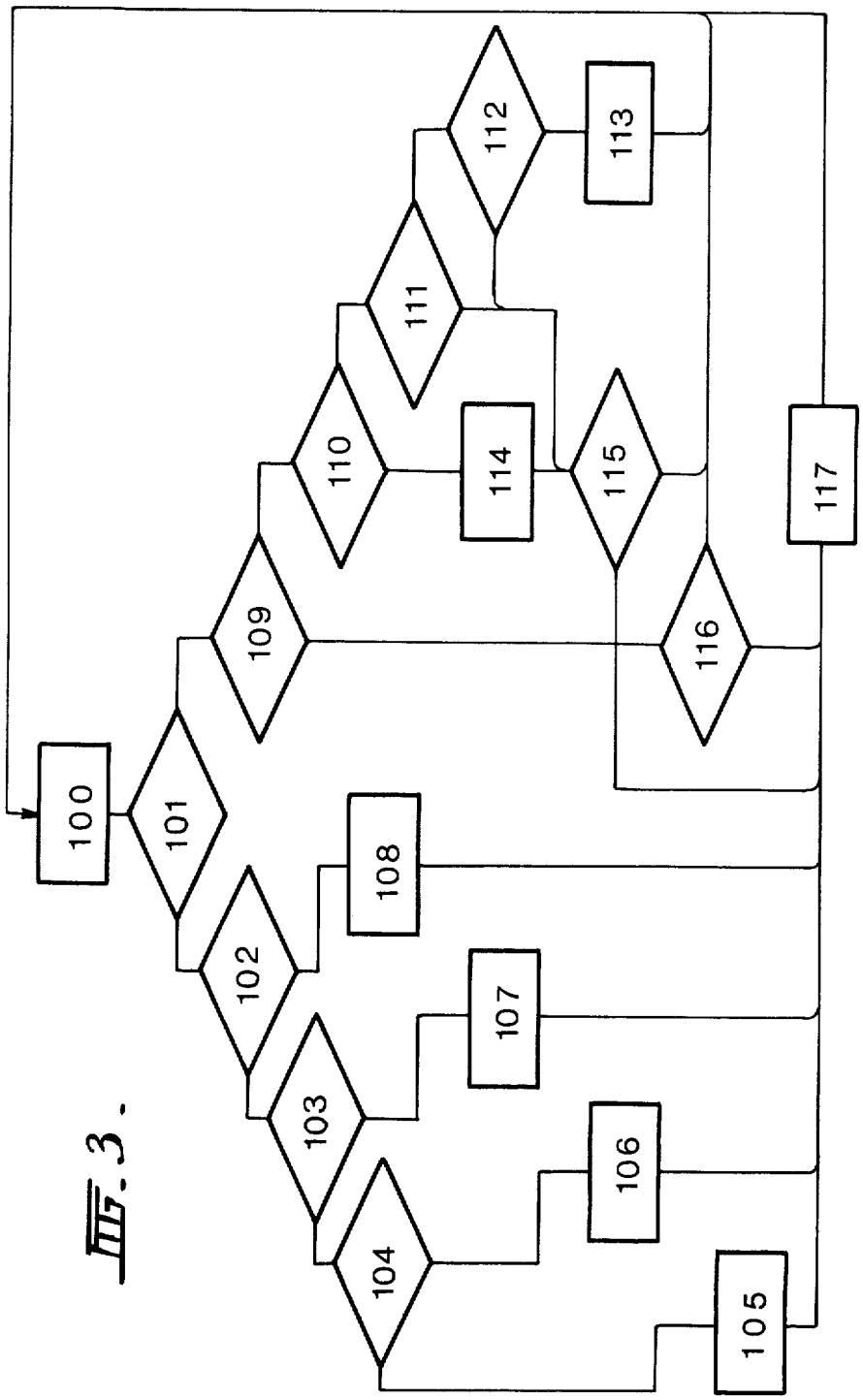
FIG. 3 is a flow diagram illustrating the hardware operation of the device of the embodiment and should not be confused with a software program.

FIG. 3 represents a flow diagram wherein the reference numerals having the meaning illustrated below. As mentioned above this diagram illustrates hardware operation and is not a software program.

| | |
|---|---|
| 100 | The memory unit presents a word to the combinational logic. |
| 101 | If the word is the End word, the left hand branch is taken. If it is a normal relay set, the right hand branch is taken. |
| 102 | If the PABX processor is making a request the left hand branch is taken, otherwise the operation 108 is performed. |
| 103 | If the PABX processor is requesting the insertion of a word (ie., it requires a relay unit to send some signal) then operation 107 is performed otherwise the processor requires a search and the left hand branch is taken. |
| 104 | If the search mechanism is off then it is turned on by operation 106, otherwise if the search mechanism is on then it must have been turned on on the previous access of the End word and action 105 is performed. |
| 105 | The control processor transmits the number zero to the PABX processor. |
| 106 | The search mechanism is turned on. |
| 107 | The word from the PABX processor is copied into the memory. |
| 108 | The control processor generates an idle word for the relay set whose number is in the count field of this word and then decrements the count field. |
| 109 | If the Done bit is turned on then the test 116 is performed, otherwise the right hand branch is taken. |
| 110 | If the main function action required for this word is signal processor then the right hand branch is taken otherwise action 114 is performed. |
| 111 | If the search mechanism is turned on then the test of 115 is performed, otherwise the right hand branch is taken. |
| 112 | If the data field from the ROM 16 specified a signal satisfying the processor request then action of 113 is performed, otherwise the left hand branch is taken. |
| 113 | The control processor transmits the number of this relay set to the control processor. |
| 114 | One of the actions Set Relay, Set Count field, Set State field, as determined by Main function field from ROM 16 is performed. |
| 115 | If the auxiliary function field of ROM 16 requires an erase then action 100 is performed, otherwise action 117 is performed. |
| 116 | If the auxiliary function field requires an " erase if Done" function then the right hand branch is taken, otherwise action 117 is performed. |
| 117 | The word assembled in block 19 is copied into the memory. |

The device of the invention is capable of setting relays performing timing functions on all the relay units. The logic which performs sequences of the different functions is contained within the ROM 16.

Two fields address the ROM 16, one field is 1 out of 16 states which comes from the memory 10. These states are numbered zero to fifteen. The second field of three bits is the condition of the relay unit. These conditions are as follows:

| CONDITION | STATE | TIMING FROM 10.4Hz CLOCK |
|---|---|---|
| 0 | Count field is zero | None |
| 1 | Ring detected | None |
| 2 | F1 or F2 set | Mark |
| 3 | F1 or F2 set | Space |
| 4 | F1 and F2 both off | Mark |
| 5 | F1 and F2 both off | Space |
| 6 | F1 and F2 both on | Mark |
| 7 | F1 and F2 both on | Space |

In order that the invention may be more readily understood the operation of the device will now be described in relation to one of the functions it performs, namely, dialling.

| STATE | CONDITION | ACTION | DESCRIPTION |
|---|---|---|---|
| 3 | 3 | Signal dial | This is the normal state at which the dial instruction begins. The relay unit in use performs no action other than signal dialling. At this stage the count field contains the digit which has been obtained from PABX processor. |
| 3 | 2 | Set relays 1 and 2 | This is the beginning of the dial sequence. Relays F1 and F2 are set which, since relay F1 is already set, has no effect other than shorting the line. |
| 3 | 6 | Signal dial | The device waits till the end of the make period and signals dial. |
| 3 | 7 | Set state 15 | State is changed to 15 |

-continued

| STATE | CONDITION | ACTION | DESCRIPTION |
|---|---|---|---|
| 15 | 7 | Signal dial | in order to begin the actual dialling. Wait for the end of the break pulse and signal dial. |
| 15 | 6 | | Set relay F2. This has the effect of shorting the line while relay F1 is released. |
| 15 | 2 | Signal dial | This is the normal condition during the make period of the dial impulsing. This state signals dial to the PABX processor. |
| 15 | 3 | Set no relays | This state is reached at the beginning of the break of a dial impulse. The action is that all relays are released so that the line is completely open circuit. |
| 15 | 5 | Signal dial | This is the normal state during the break period of a dial pulse. |
| 15 | 4 | Set relay 2, decrement count | At this point the make period of a dial pulse begins and the count field decremented by 1 if more pulses must be sent, the next state will be state 15, condition 2. If no further pulses are to be sent then the count field will be zero. |
| 15 | 0 | Set state 14 | This is the condition reached when all the dial pulses have been sent. It then begins in inter-digital pause with relay F2 set. |
| 14 | 0 | Set count 5 | The count is set to 5. This is the beginning of the inter-digital pause in both a dial and the connect to line instructions. |
| 14 | 2 | Signal dial | This is the condition in which an inter-digital pause during dialling begins. The action here is to signal dial and wait until the beginning of a break period. |
| 14 | 3 | Set relays 1 and 2 | |
| 14 | 7 | Signal dial | This is the entry at which the connect to line inter-digital pause begins. This again is a do nothing state with both relays set. |
| 14 | 6 | | The state is set to 13 so that both relays continue to be set during the make period. |
| 13 | 6 | | The action during this state is to signal dial. |
| 13 | 7 | Set relay 1 | Relay F1 is turned on and other relays are released. This is the normal state during which conversation occurs. |
| 12 and 13 | 2 and 3 | | These four states are used to time out the inter-digital pause. The total inter-digital pause from the end of the last break to the beginning of the first break of the earliest possible subsequent dial pulse is exactly 800 msec. |
| 13 | 0 | Erase | This is the condition reached at the end of the time out of the inter-digital pause and in this state the only action is to erase this word from the device thus permitting any subsequent instruction to operate. |

From the above it will be apparent that the control processor bears some similarity to a normal digital processor. However, there are two fundamental differences. Firstly, in the operation of a normal digital processor there are at least two cycles, firstly a fetch cycle in which an instruction selected by some means is obtained from a program memory and secondly an execute cycle in which the instruction so obtained performs its function. This function is usually the accessing of data from some memory location for manipulation. The control processor described herein does not have two separate cycles. Instead the data is fetched as for the normal processor execute cycle and the operation performed is dependent on that data. There is no sequential operation of instructions, and the action performed with any word as presented is independent of the action performed by the preceding word, except as modified by the end word when the search mechanism is enabled.

It will be seen that a number of modifications can be made to the above embodiment and some of these modifications are incorporated in a further embodiment of the processor. In the embodiment described above it is necessary to store several operations each relating to the one relay unit. For example, when it is desired to send several digits then the digits are inserted into the memory in order. If it is not necessary to store several requests for the one relay unit it is possible to reduce the size of the memory by dedicating one word to each relay unit and using a counter to address both the memory and the external devices, so that it is not necessary to store the number of the external unit in the memory. If its desired to reduce the size of the ROM (for example, to accommodate a larger number of signals) then it is advantageous to store in each word of the memory the state of the detectors of the relay unit as found on the last operation on that relay unit. When that word is next selected the current state of the detectors is compared with the previous state of the detectors and an operation is only performed if they are different. It is obviously not necessary for the device to be restricted to a single counter nor is it necessary for the test of this counter to be a test against zero. Increased flexibility can be obtained by having the second count field which is incremented at regular intervals and compared with a field obtained from the ROM, an action being performed when they are equal.

Also, it should be appreciated that the device of this invention is not limited to uses in telephony and it may be readily adapted for use in other applications, for example, the control of industrial processes from a digital computer wherein the industrial processes operate and require control over a relatively long period of time.

I claim:

1. A digital control processor for controlling the operation of a plurality of external relay units comprising a first-in first-out memory for storing a plurality of memory words, each of said memory words comprising at least two fields, one of said fields containing the address information of one of the plurality of external relay units, the other of said fields containing process control information, decoding means for decoding said field containing said address information of said external relay unit, said decoded field providing an address of one of a plurality of said external units, means for transmitting said address to said external unit, a combinational logic unit, means for transmitting information from the addressed external unit relevant to its state of operation to said combinational logic unit, said combinational logic unit accepting said information from the addressed external unit and from said memory the other of said fields of said memory word for producing process control signals, means in said combinational logic unit receiving said process control signals for generating state control signals for the addressed external unit, means in said combinational logic unit receiving said process control signals for selectively generating memory words, said memory words comprising at least two fields one of said fields containing the address information of an external relay unit, the other of said fields containing process control information, means for transmitting said state control signals to said addressed external relay unit to cause said addressed external relay unit to change its state, and means for transmitting said generated memory word to said first-in first-out memory, the generated state control and memory signals by the means in the combinational logic unit at any instant of time being determined solely by the input thereto independently of any prior inputs thereby rendering the signals generated completely independent of previously generated signals.

2. The digital control processor as defined in claim 1 wherein each of said external relay units includes storage means for storing information, said information indicating whether the external relay has been addressed or has not been addressed by said decoding means, means for transmitting said information to said combinational logic unit, wherein an addressed external relay unit which is in the previously not-addressed state transmits via said transmitting means information that it was not previously addressed to the combinational logic unit and then alters its own state to the has-been addressed state, and wherein if an external relay unit has been addressed it transmits via said transmitting means the information to the combinational logic unit and remains in the addressed state.

3. The digital control processor of claim 2 further comprising a privileged external device having means to set all external relay units into the has-not-been addressed state, and means for coupling information to said memory relating to at least one of said external relay units, wherein each external relay unit is only adapted to insert information into said memory relative to its own state.

4. The digital control processor of claim 3 further comprising means for interrogating a predetermined external relay unit in response to a command from said privileged external device.

* * * * *